United States Patent [19]

McClure et al.

[11] Patent Number: 4,992,699
[45] Date of Patent: Feb. 12, 1991

[54] X-RAY PHOSPHOR IMAGING SCREEN AND METHOD OF MAKING SAME

[75] Inventors: Richard J. McClure, San Diego; Frederick J. Jeffers, Escondido, both of Calif.

[73] Assignee: Eastman Kodak Company, Rochester, N.Y.

[21] Appl. No.: 403,246

[22] Filed: Sep. 5, 1989

[51] Int. Cl.$^5$ .............................................. H01J 31/50
[52] U.S. Cl. ..................................... 313/525; 156/647; 156/659.1; 427/65; 427/160; 378/190
[58] Field of Search ........................... 156/647, 659.1; 313/461, 525; 427/160, 64, 65, 157; 378/42, 44, 62, 190, 34; 250/484.1, 487.1; 428/156

[56] References Cited

U.S. PATENT DOCUMENTS

| | | | |
|---|---|---|---|
| 3,944,835 | 3/1976 | Vosburgh | 250/487.1 |
| 4,025,662 | 5/1977 | Sumner | 427/65 |
| 4,735,396 | 4/1988 | Hamakawa | 156/647 |

FOREIGN PATENT DOCUMENTS

| | | | |
|---|---|---|---|
| 53-120376 | 10/1978 | Japan | 156/647 |
| 59-49141 | 3/1984 | Japan | 427/65 |

Primary Examiner—Kenneth M. Schor
Assistant Examiner—John J. Bruckner
Attorney, Agent, or Firm—William F. Noval

[57] ABSTRACT

A close packed planar array corner cube surface is employed in making an x-ray image intensifier screen. The corner cube surface is produced from single cube silicon crystal using a photoresist pattern of an array of triangle openings aligned with the <110> directions of the cube in a {111} plane facial surface of the wafer. Corner cube cells are etched in the wafer surface with an anisotropic etchant preferentially etching the {100} planes of the cubic lattice. A method for producing a retro-reflective surface from the etched silicon wafer for making the x-ray phosphor imaging screen is described.

15 Claims, 2 Drawing Sheets

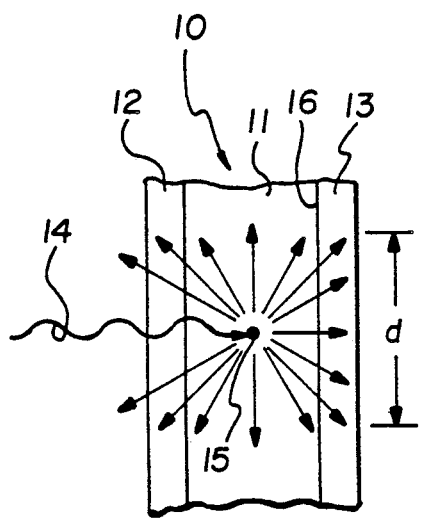
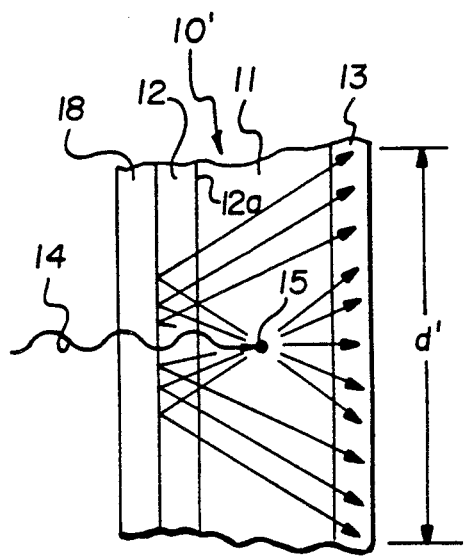
FIG. 1
(PRIOR ART)
FIG. 2
(PRIOR ART)
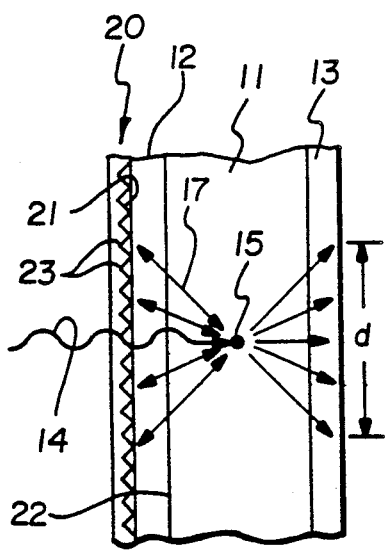
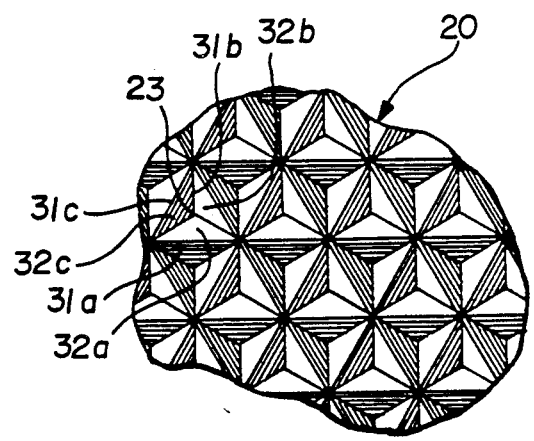
FIG. 3
FIG. 4

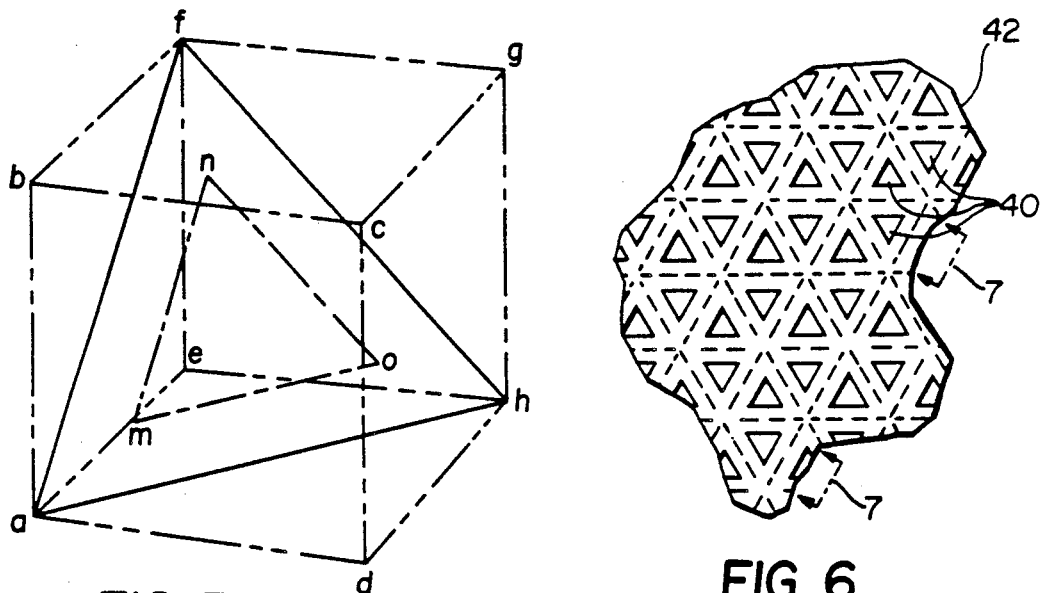
FIG. 5
FIG. 6
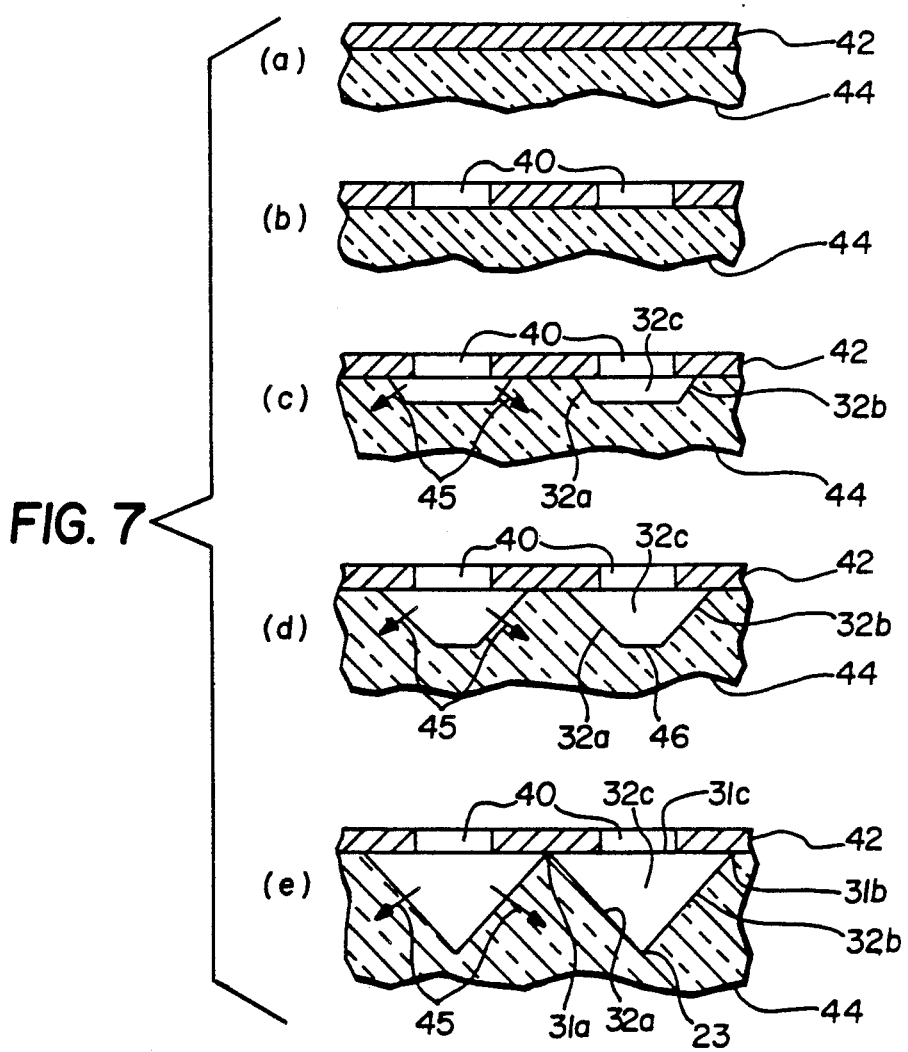
FIG. 7

X-RAY PHOSPHOR IMAGING SCREEN AND METHOD OF MAKING SAME

CROSS REFERENCE TO RELATED APPLICATION

Reference is made to copending application Ser. No. 243,374 entitled "An X-Ray Intensifying Screen Permitting an Improved Relationship of Imaging Speed to Sharpness" filed by the assignee of the present application, now U.S. Pat. No. 4,912,333.

1. Field of the Invention

This invention relates to x-ray imaging screens of the type employing x-ray stimulable phosphors to generate light emissions which are then used to expose photosensitive films or light sensitive solid state sensors to generate the x-ray image.

2. Background of the Invention

It is known to provide an x-ray imaging screen in which a layer of phosphor is used to intercept x-rays in, for example, the 15-115 keV energy range to generate photoemissions which are then used to expose a photosensitive film or a light sensitive solid state sensor to generate the desired x-ray image.

An example of such a screen is shown in FIG. 1, wherein the x-ray imaging screen 10 comprises a phosphor layer 11 formed on a substrate 12 and a photosensitive film sheet 13 pressed against the phosphor side of the screen. When a bundle of x-ray energy 14 enters the phosphor layer and is absorbed by a phosphor particle 15, the particle fluoresces thus emitting light rays relatively uniformly in all directions as indicated by the arrows in FIG. 1. Those light rays which exit the phospher layer through the right-hand surface 16 enter the light sensitive film 13 and expose the film emulsion. The film can then be processed using conventional developing techniques to bring out a permanent record of the x-ray image formed on the film. An advantage of this arrangement over the use of direct exposure of the film to the x-ray energy lies in the greater sensitivity of the screen achieved by suitable selection of the phosphor material with high atomic numbers to increase the x-ray absorption efficiency of the screen.

One disadvantage of this arrangement, however, is that only some percentage, less than 50 percent, of the total light emitted from the stimulated phosphor is directed at the film. Light rays directed parallel to the face of the phosphor layer or directed away from the film are lost, thus limiting the efficiency in the conversion of x-ray energy to light effective in sensitizing the film.

Light collection efficiency of an arrangement of this type, and therefore overall sensitivity, can be increased by sandwiching the phosphor layer between two sheets of film thus capturing the light rays that escape from both facial surfaces of the phosphor screen. The composite image is then created by superimposing the two films after development. Another known approach to increasing sensitivity is shown in the modified screen 10' of FIG. 2 wherein mirror 18 is positioned on the left-hand side of the screen opposite the film 13. The light rays which would normally exit from this non-film side of the phosphor layer 11 are reflected by the mirror 18 to the film. Rather than using a separate mirror, the same effect may also be created by aluminizing the surface 12a of the phosphor substrate 12 prior to depositing the phosphor. Although the mirrored arrangement of FIG. 2 has the advantage of improving the light collection efficiency and therefore the sensitivity of the screen, it has the disadvantage that resolution is degraded by virtue of the increased effective spot size d' resulting from the reflected light, as compared to the smaller spot size d in FIG. 1 which results solely from the direct light rays.

In copending application Ser. No. 243,374 co-owned by the assignee of the present invention, it is suggested that light collection efficiency of a phosphor x-ray image intensifying screen can be improved by using a retro-reflective lenslets as the reflecting medium. A retro-reflective surface has the characteristic of reflecting incident light rays along an axis of reflection that is substantially parallel with the axis of the incident light ray. Because of this, the resultant illuminated spot size on the film is effectively the same as the spot size d in FIG. 1 created by the direct light rays, however with a greater intensity. Consequently, the use of a retro-reflector surface can increase the sensitivity of the imaging screen without a significant degradation of resolution in the image.

While recognizing the advantage of a retro-reflector surface in x-ray intensifying screens, the copending application discloses only the use of lenslets in the form of microbeads as the retro-reflective medium. Effective as they are for this purpose, they have certain deficiencies resulting from the fact that close packed beads inherently have voids therebetween that reduce the reflection efficiency. They also have bands around the outer circumference of each bead that do not act as reflectors.

It is therefore an object of the present invention to provide an x-ray stimulable phosphor imaging screen employing a retro-reflective back surface to enhance sensitivity but without experiencing the significant loss of resolution incurred with planar reflection surfaces.

It is a further object of the invention to provide an imaging screen of the type described with a corner cube retro-reflector surface in which the corner cube apertures are microscopically small so as to be effective as a retro-reflector with light sources originating within relatively thin phosphor layers.

It is yet another object of the invention to provide a method of forming a surface with an array of microscopically small corner cubes.

It is still a further object of the invention to provide a method of making a sheet of retro-reflective material suitable for use in an x-ray stimulable phosphor imaging screen.

SUMMARY OF THE INVENTION

In carrying out the foregoing objects of the invention, there is provided a method of making a planar array corner cube surface which comprises the steps of forming a wafer of single crystal material, such as silicon, having a cubic lattice structure with the facial surface of the wafer oriented in a {111} plane of the cubic structure, forming on the facial surface of the wafer a photoresist pattern of an array of equilateral triangle openings, the sides of the triangle openings being parallel to the <110> directions of the cubic lattice in said {111} plane of the facial surface of the cubic structure, the parallel sides of adjacent triangle openings being spaced apart by a predetermined amount throughout the array pattern and etching said crystal material with an anisotropic etchant adapted to preferentially etch {100} planes of the cubic lattice structure to form a corresponding array of internal corner cube pyramidal surfaces under the triangle openings of the photoresist pattern. At the completion of the etching step, the photoresist is removed to leave a planar array corner cube surface on the wafer facial surface.

Having created the planar array corner cube surface, a retro-reflective sheet suitable for use as a back reflector for an x-ray stimulable phosphor imaging screen may be produced by forming a negative master of the corner cube surface, as by metal plating, and separating the negative master from the single crystal surface. A sheet having a planar array corner cube surface matching that of the etched crystal is then formed on the negative master, as by any molding process. After removal of the sheet from the negative master, the corner cube surface is made reflective by any suitable means such as evaporation of aluminum onto the surface.

BRIEF DESCRIPTION OF THE DRAWINGS

In the drawings:

FIG. 1 is a schematic cross section of a prior art form of x-ray stimulable phosphor imaging screen.

FIG. 2 is a schematic cross section of another prior art form of x-ray stimulable phosphor imaging screen.

FIG. 3 is a schematic cross section of an x-ray stimulable phosphor imaging screen produced in accordance with the present invention.

FIG. 4 is a plan view of a portion of a corner cube retro-reflector surface produced in accordance with the present invention and embodied in the imaging screen of FIG. 3.

FIG. 5 is a isometric diagram of a cube lattice useful in explaining the method and structure of the present invention.

FIG. 6 is a plan view of a portion of a photoresist mask pattern used in the method of the present invention.

FIG. 7 is a series of cross sectional views of a segment of a corner cube master panel illustrating the method of the invention.

DETAILED DESCRIPTION

As previously discussed, FIGS. 1 and 2 effectively illustrate the dilemma between light collection efficiency and image resolution when a planar mirror surface is used to increase efficiency of the phosphor screen by reflecting light rays that would otherwise be lost to the photosensitive film. The mirror 18 in FIG. 2 reflects the fluorescent light rays outward thus significantly increasing the area of the spot size d' on the film 13 as compared to spot size d in the screen of FIG. 1.

A presently preferred embodiment of the imaging screen of the invention is illustrated in FIG. 3, wherein the planar mirror 18 of FIG. 2 is replaced by a sheet 20 having a corner cube retro-reflective surface 21 positioned facing the facial surface 22 of the phosphor layer 11. In the illustrated embodiment, sheet 20 is positioned in contact with the outer surface of substrate 12 on which the phosphor layer 11 is deposited. Alternatively, the phosphor layer 11 may be deposited directly on sheet 20 thus eliminating the intermediate substrate 12. It should be understood that the drawings are not to scale, but are drawn so as to best illustrate the concepts involved. It will also be appreciated that the materials used for fabrication of the retro-reflective sheet preferably should be substantially transparent to the x-radiation to be detected so as to allow penetration of the x-rays into the phosphor layer 11.

Retro-reflective surfaces are known to exhibit the characteristic of reflecting incident light back substantially along an axis parallel to the axis of the incident light illumination as shown by double arrow 17. The smaller the aperture of the corner cube reflecting cell, the more nearly the incident and reflecting axis will be coincident. Accordingly, by virtue of the retro-reflective characteristic of reflector sheet 20, the light rays that would normally exit from the left-hand facial surface 22 of phosphor layer 11 or that would be reflected outward over an expanding area by a planar mirror surface, instead, are reflected back effectively along an axis passing through the original light source 15 and thus serve to reinforce the exposure on film 13 with substantially the same spot size d as is realized with the unmodified screen of FIG. 1 except with a greater brightness. Thus sensitivity of the screen is improved without significant loss of resolution.

As is known, a corner cube retro-reflector surface, best seen in FIG. 4, consists of a planar array of three-sided, interior pyramidal surfaces such as would be formed by the intersection of the corner of a cube by a plane normal to a line joining diametrically opposed corners of the cube. Thus in FIG. 4, each interior pyramidal surface is formed by base lines 31a–31c lying in the plane of the paper and defining an open equilateral triangular aperture and by three planar sides 32a–32c defining isosceles triangle surfaces meeting at a common apex 23 positioned below the plane of the paper. These interior pyramidal surfaces are coated with a suitable reflective surface treatment, e.g. by aluminizing, to form the desired retro-reflective surface 21 (FIG. 3).

It is the nature of retro-reflector surfaces that the farther away the light source is from the plane of the array of reflector surfaces, the more the reflected light is truly retro-reflective with minimum reflective light scatter occurring. Stated another way, the aperture of the reflector cell ideally should be very small in comparison to the distance of the light source from the aperture in order to preserve the desired resolution in the image created on film 13. In phosphor screens of the type contemplated by the present invention, the distance from the light source to the retro-reflective surface is dependent on the distance the x-ray penetrates into the phosphor layer before it is absorbed thereby creating a fluorescent event (plus the thickness of the phosphor substrate, if one is employed between the phosphor layer and the reflector surface). While a thicker phosphor layer would increase the absorption efficiency of the screen and simultaneously increase the mean distance of phosphor events from the retroreflector surface, the maximum thickness is constrained by light scatter considerations which can degrade image resolution. Fluorescent events occurring remote from the film layer, corresponding to minimal x-ray penetration of the phosphor layer, inherently create a larger diameter spot on the film than events occurring close to the film layer. For typical x-ray phosphor compositions, a thickness range of from 50 microns to 200 microns is generally considered acceptable.

For fluorescent events occurring in phosphor layers within this range of thickness, adequate retro-reflection can be achieved if the aperture of the reflector cell is about 50 microns, or smaller, as measured along an orthogonal line extending from one of the baselines 31a–31c to the corresponding opposite apex lying in the plane of the paper. The minimum aperture size, however, is limited by the wavelength of the incident fluorescent light rays in order to avoid the effects of diffraction. For this reason, the minimum aperture size is about 10λ, where λ is the wavelength of the incident light ray. Assuming a typical wavelength λ of about 0.5 micron, a reflector cell aperture of about 5 microns would thus give preferred retro-reflection characteristics for screens of the type being considered, although larger aperture sizes up to about 50 microns should also work satisfactorily, as previously noted.

A suitable corner cube reflector surface with apertures of this small size may be produced from single crystal cubic lattice silicon wafers which have been etched with an anisotropic etchant to produce a master pattern of corner cube reflector cells. To aid in understanding the description of this process, it will be helpful to review the well known convention of Miller indices for describing three dimensional crystalline lattice structure and, more particularly, as applied to the specific example of a cube lattice.

Referring to FIG. 5, the cube "abcdefgh" has six face planes, each of which can be specified by a set of three coordinates representing normalized intercepts of three mutually orthogonal reference axes. Thus face "abcd" is represented in Miller indices within parentheses as the (100) plane and face "efgh" is represented as the ($\bar{1}$00) plane. The remaining four faces of equivalent symmetry are represented individually as follows:

| "cghd" = (0$\bar{1}$0) | "bfgc" = (001) |
|---|---|
| "abfe" = (010) | "aehd" = (00$\bar{1}$) |

Similarly, the canted plane of triangle "ahf" is represented as (111) and the plane of triangle "bge" as (11$\bar{1}$). The remaining six canted planes of equivalent symmetry in the indicated triangles are then represented individually as follows:

| "deg" = (1$\bar{1}$1) | "hac" = ($\bar{1}\bar{1}$1) | "edb" = ($\bar{1}$11) |
|---|---|---|
| "cfh" = (1$\bar{1}\bar{1}$) | "gbd" = ($\bar{1}$11) | "fca" = ($\bar{1}$1$\bar{1}$) |

All planes of equivalent symmetry can be represented by a single expression using curly brackets (braces) in place of the parentheses. Thus all cube face planes are represented by the expression {100} while all of the above-described canted planes of the cube can be represented by the expression {111}.

Directions in a cube crystal are expressed in integers of a vector in the desired direction referred to the axis vectors and are written in square brackets [] to represent individual directions or in angled brackets < > to denote all directions of equivalent symmetry. In the cube of FIG. 5, the "x" axis "ea" is the [100] direction and the "-x" axis "ae" is the [$\bar{1}$00] direction. Similarly the line "af" in FIG. 5 is in the [$\bar{1}$01] direction while "fa" is in the [10$\bar{1}$] direction. A full set of equivalent directions is thus expressed as <110> with the subsets [$\bar{1}$01], [10$\bar{1}$], [01$\bar{1}$], [0$\bar{1}$1], [1$\bar{1}$0] and [$\bar{1}\bar{1}$0] being the directions of the three lines of intersection of the illustrated (111) plane in the cube faces. It will be appreciated that each of the equivalent symmetry planes {111} will have a corresponding subset of associated directions included within the expression <111>.

Considering now the process by which a corner cube retro-reflector surface is prepared according to the present invention, a wafer of single crystal material having cubic crystal symmetry, preferably silicon, is formed to have a planar facial surface oriented in a {111} plane of the cubic lattice structure. A layer of photoresist material is then coated onto the facial surface of the wafer. Using known lithographic techniques, a pattern of an array of close packed equilateral triangle openings is formed in the photoresist layer. The triangle openings are oriented in the pattern with the sides of each triangle parallel to the <110> directions of the cube lattice structure lying in the {111} plane of the facial surface of the wafer and with parallel sides of adjacent triangle openings spaced apart by a predetermined amount as will be explained later. This physical arrangement may best be visualized with reference to the diagram of FIG. 6 which illustrates the geometric orientation of triangle openings 40 relative to the cubic lattice structure shown in FIG. 5.

In FIG. 6, a layer of photoresist material 42 has formed therein a pattern of a close packed array of equilateral triangle openings 40. The sides of the triangle openings are oriented parallel to the <110> directions of the cube lattice structure (lines ag, gf, and fa in FIG. 5) lying in the {111} plane of the facial surface of the single cube silicon wafer 44 (FIG. 7) on which the layer of photoresist material is deposited. Typically, a silicon wafer is produced with a reference edge cut in one side of the wafer to indicate the cube lattice orientation of the wafer. This reference edge can be specified to be cut parallel to a <110> direction to indicate the desired physical orientation of the wafer relative to the crystal axes. Thus when the lithographic mask of equilateral triangles is produced, a corresponding reference edge is incorporated in the mask parallel to a triangle side which may then be aligned with the reference edge of the wafer to assure proper alignment of the mask on the photoresist layer to achieve parallelism between the triangle openings and the <110> directions of the cube lattice structure. Because of the rotational symmetry of the triangle pattern and the <110> directions in the {111} of the wafer face, it is only necessary for the reference edge of the mask to be parallel with a single triangle edge to achieve the desired orientation of the triangle openings with the cube lattice structure.

Referring now to FIG. 7, the process by which the desired corner cube pattern is etched in the silicon wafer will be considered. FIG. 7 illustrates schematically the stages of development of the corner cube pattern beginning with the deposition of photoresist layer 42 on the silicon wafer 44. After development of the photoresist with the triangle array mask as described above, a plurality of properly oriented triangle openings 40 are formed in the photoresist layer 42. An anisotropic etchant selected to preferentially etch {100} planes of the cubic lattice structure of the silicon wafer 44 is then flowed in a known manner over the surface to the photoresist pattern to begin anisotropic etching of the {100} planes 32a–32c. Suitable etchants to achieve anisotropic etching of {100} planes in silicon are described in the book *Integrated Circuit Fabrication Technology* by David J. Elliott and published by McGraw-Hill Book Company, 1982, on pages 248–250. Once etching commences along the {100} planes 32a–32c, as represented by arrows 45 in FIG. 7c, the process continues along the selected {100} planes with an increasing cavity size as the {111} plane surface 46 gradually decreases in each created cell. Eventually, the process is completed when the {111} plane is fully depleted and the {100} planes 31a–31c meet at apex 23. In order to produce x-ray imaging screens, it is desirable to create the corner cube array in such a manner that no residual {111} plane surface remains between adjacent corner cubes. To achieve this result, the spacing between adjacent parallel sides of the triangle openings in the photoresist pattern is determined relative to the etch rate of the chosen etchant to allow the {100} planes of adjacent corner cubes to meet at the baselines of intersection 31a–31c corresponding to the <110> directions in the facial surface of wafer 44 at least by the time the anisotropic etching of the corner cube is completed. At the completion of the etching process, the photoresist material 42 is washed off the silicon in known manner to thus leave the desired corner cube surface.

The resulting corner cube surface on the face of wafer 44 may then serve as a pattern to form a negative master by plating a metal on the wafer which may then be separated from the wafer by peeling apart or dissolving the silicon. This metal master can then be coated with a suitable material such as is used in making film substrates to create the corner cube sheet 20 of FIG. 4 which, after hardening and removal, can be reflectorized, for example by evaporation of aluminum on the corner cube surface of the sheet.

At the present time, silicon wafers are produced in relatively small dimensions, typically in circular wafers of about six inches in diameter. In order to make a corner cube sheet large enough to be used for producing x-ray imaging screens, a plurality of silicon wafers cut to suitable square or rectangular dimensions can be etched to prepare the master corner cube surface after which the wafers may be abutted to create the desired size of sheet. Cutting of the wafers may be done before or after the etching process.

The invention has thus been described in detail with particular reference to a presently preferred embodiment, but it will be understood that variations and modifications can be effected within the spirit and scope of the invention.

What is claimed is:

1. A method of making a planar array corner cube surface comprising the steps of:
    forming a wafer of single crystal material having a cubic lattice structure with the facial surface of the wafer oriented in a {111} plane of the cubic structure;
    forming on the facial surface of the wafer a photoresist pattern of an ordered array of closely packed equilateral, triangle openings wherein adjacent openings have paired, coextensive, parallel sides, the sides of the triangle openings being parallel to the <110> directions of the cubic lattice in said {111} plane of the facial surface of the cubic structure, and said parallel sides of adjacent triangle openings being spaced apart by a predetermined amount through the array pattern;
    etching said crystal material with an anisotropic etchant which will preferentially each {100} planes of the cubic lattice structure to form a corresponding array of internal corner cube pyramidal surfaces under the triangle openings of the photoresist pattern so that substantially no residual {111} plane surface remains between adjacent corner cubes;
    and removing the photoresist pattern to leave a planar array corner cube surface on the wafer facial surface.

2. The method of claim 1 in which said paired, coextensive, parallel sides of adjacent triangle openings are spaced equidistantly apart throughout the array pattern.

3. The method of claim 1 in which the wafer is single crystal silicon of cubic lattice structure.

4. A layer having a close packed planar array corner cube surface produced by the method of any of claims 1, 2 or 3.

5. The method of claims 2 or 3 in which the spacing between said paired, coextensive, parallel sides of adjacent triangle openings is such so as to allow {100} planes of adjacent corner cubes to meet at least by the time anisotropic etching of the corner cubes is completed.

6. A method of making a sheet having a planar array corner cube retro-reflective surface comprising:
    forming a wafer of single crystal material having a cubic lattice structure with the facial structure of the wafer oriented in a {111} plane of the cubic structure;
    forming on the facial surface of the wafer a photoresist pattern of an ordered array of closely packed equilateral triangle openings wherein adjacent openings have paired, coextensive, parallel sides, the sides of the triangle openings being parallel to the <110> directions of the cubic lattice in said {111} plane of the facial surface of the cubic structure, and said parallel sides of adjacent triangle openings being spaced apart by a predetermined amount throughout the array pattern;
    etching said crystal material with an anisotropic etchant which will preferentially etch {100} planes of the cubic lattice structure to form a corresponding array of internal corner cube pyramidal surfaces under the triangle openings of the photoresist pattern so that substantially no residual {111} plane surface remains between adjacent corner cubes;
    removing the photoresist pattern to leave a planar array corner cube surface on the wafer facial surface;
    forming a negative structure from the planar array corner cube surface;
    forming a sheet having sufficient thickness to form a complete positive duplicate of the planar corner cube surface when the sheet is separated from the negative structure, the negative structure, with a complete positive duplicate of the planar array corner cube surface being formed on one face of the sheet;
    separating the sheet from the negative structure;
    and coating the corner cube surface of the sheet with an optically reflective material to form a corner cube retroreflective surface.

7. The method of claim 5 in which said paired, coextensive, parallel sides of adjacent triangle openings are spaced equidistantly apart throughout the array pattern.

8. The method of claim 5 in which the wafer is single cube silicon.

9. A sheet having a planar array corner cube retro-reflective surface produced by the method of any of claims 6, 7 or 8.

10. The method of claims 7 or 8 in which the spacing between said paired, coextensive, parallel sides of adjacent triangle openings is such so as to allow {100} planes of adjacent corner cubes to meet at least by the time anisotropic etching of the corner cubes is completed.

11. A method of making an x-ray imaging phosphor screen comprising:

forming a wafer of single crystal material having a cubic lattice structure with the facial surface of the wafer oriented in a {111} plane of the cubic structure;

forming on the facial surface of the wafer a photoresist pattern of an ordered array of closely spaced equilateral triangle openings wherein adjacent openings have paired, coextensive, parallel sides, the sides of the triangle openings being parallel to the <110> directions of the cubic lattice in said {111} plane of the facial surface of the cubic structure, and said parallel sides of adjacent triangle openings being spaced apart by a predetermined amount throughout the array pattern;

etching said crystal material with an anisotropic etchant which will preferentially etch {100} planes of the cubic lattice structure to form a corresponding array of internal corner cube pyramidal surfaces under the triangle openings of the photoresist pattern so that substantially no residual {111} plane surface remains between adjacent corner cubes;

removing the photoresist pattern to leave a planar array corner cube surface on the wafer facial surface;

forming a negative structure from the planar array corner cube surface;

forming a sheet having sufficient thickness to form a complete positive duplicate of the planar corner cube surface when the sheet is separated from the negative structure, said sheet being made of substantially x-ray transparent material, formed on the negative structure with the complete positive duplicate of the planar array corner cube surface being formed on one face of the sheet;

separating the sheet from the negative structure;

coating the corner cube surface of the sheet with a substantially x-ray transparent, light reflective material to form a corner cube retro-reflective surface;

forming a layer of x-ray absorbing, light emitting phosphor;

and positioning said sheet face-to-face against the phosphor layer with the corner cube retro-reflective surface facing the phosphor layer.

12. The method of claim 9 in which said paired, coextensive, parallel sides of adjacent triangle openings are spaced equidistantly apart throughout the array pattern.

13. The method of claim 11 in which the wafer is single cube silicon.

14. An x-ray imaging phosphor screen produced by the method of any of claims 11, 12 or 13.

15. The method of claims 12 or 13 in which the spacing between said paired, coextensive, parallel sides of adjacent triangle openings is such so as to allow {100} planes of adjacent corner cubes to meet at least by the time anisotropic etching of the corner cubes is completed.

* * * * *